(12) United States Patent
deVilliers

(10) Patent No.: US 9,240,329 B2
(45) Date of Patent: Jan. 19, 2016

(54) METHOD FOR MULTIPLYING PATTERN DENSITY BY CROSSING MULTIPLE PATTERNED LAYERS

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Minato-Ku, Tokyo (JP)

(*) Notice: Subject to any disclaimer, the term of this patent is extended or adjusted under 35 U.S.C. 154(b) by 0 days.

(21) Appl. No.: 14/623,947

(22) Filed: Feb. 17, 2015

(65) Prior Publication Data

US 2015/0243518 A1 Aug. 27, 2015

Related U.S. Application Data

(60) Provisional application No. 61/943,483, filed on Feb. 23, 2014.

(51) Int. Cl.
*H01L 21/311* (2006.01)
*H01L 21/3205* (2006.01)
*H01L 21/321* (2006.01)

(52) U.S. Cl.
CPC .......... *H01L 21/311* (2013.01); *H01L 21/3205* (2013.01); *H01L 21/3212* (2013.01)

(58) Field of Classification Search
None
See application file for complete search history.

(56) References Cited

U.S. PATENT DOCUMENTS

| | | | | |
|---|---|---|---|---|
| 5,618,383 | A * | 4/1997 | Randall | H01L 21/0271 257/E21.024 |
| 7,838,341 | B2 * | 11/2010 | Dennison | H01L 27/2409 257/3 |
| 8,802,451 | B2 * | 8/2014 | Malmhall | B28Y 10/00 257/295 |
| 8,871,646 | B2 * | 10/2014 | DeVilliers | H01L 21/0273 438/689 |
| 2003/0032273 | A1 * | 2/2003 | Tseng | H01L 27/11521 438/594 |
| 2007/0148968 | A1 | 6/2007 | Kwon et al. | |
| 2008/0057692 | A1 * | 3/2008 | Wells | H01L 21/0337 438/597 |
| 2010/0136784 | A1 | 6/2010 | Mebarki et al. | |
| 2010/0243161 | A1 | 9/2010 | Tran | |
| 2011/0111596 | A1 | 5/2011 | Kanakasabapathy | |
| 2011/0151668 | A1 | 6/2011 | Tang et al. | |
| 2011/0269252 | A1 | 11/2011 | Sant et al. | |
| 2013/0089984 | A1 * | 4/2013 | Raghunathan | H01L 21/0338 438/696 |
| 2015/0108585 | A1 * | 4/2015 | Loubet | H01L 21/823431 257/401 |
| 2015/0243519 | A1 * | 8/2015 | deVilliers | H01L 21/31055 438/692 |
| 2015/0255542 | A1 * | 9/2015 | Cai | H01L 29/1054 257/401 |

OTHER PUBLICATIONS

International Application No. PCT/US2015/016120, "International Search Report and Written Opinion," mailed May 26, 2015, International filing date Feb. 17, 2015.

* cited by examiner

*Primary Examiner* — Allan Olsen
(74) *Attorney, Agent, or Firm* — DLA Piper LLP (US)

(57) ABSTRACT

Techniques disclosed herein include increasing pattern density for creating high-resolution contact openings, slots, trenches, and other features. A first line-generation sequence creates a first layer of parallel lines of alternating and differing material by using double-stacked mandrels, sidewall image transfer, and novel planarization schemes. This line-generation sequence is repeated on top of the first layer of parallel lines, but with the second layer of parallel lines of alternating and differing material being oriented to elevationally cross lines of the first layer. Etching selective to one of the materials within the double stack of parallel lines results in defining a pattern of openings, slots, etc., which can be transferred into underlying layers. Such patterning techniques herein can quadruple a density of features in a given pattern, which can be described as created a pitch quad.

20 Claims, 5 Drawing Sheets

METHOD FOR MULTIPLYING PATTERN DENSITY BY CROSSING MULTIPLE PATTERNED LAYERS

CROSS REFERENCE TO RELATED APPLICATIONS

The present application claims the benefit of U.S. Provisional Patent Application No. 61/943,483, filed on Feb. 23, 2014, entitled "Method for Multiplying Pattern Density by Crossing Multiple Patterned Layers," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of traditional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

There exist various patterning approaches such as LELE (Litho/Etch/Litho/Etch), LLE (Litho/Litho/Etch), Litho/Freeze/Litho/Etch (LFLE), directed self-assembly of block copolymers, and sidewall image transfer using atomic layer deposition (ALD). Although it is possible for these patterning techniques to increase pattern density, conventional patterning techniques suffer from poor resolution or rough surfaces of contact openings and other features—especially when attempting to create very small contact openings and trenches, such as features having critical dimensions (CDs) less than about 20 nanometers. Thus, conventional techniques cannot provide a level of uniformity and fidelity desired for very small dimensions. Reliable lithographic techniques can produce features having a pitch of about 80 nm. Conventional and emerging design specifications, however, desire to fabricate features having critical dimensions less than about 20 nm or 10 nm. Directed self-assembly (DSA) of block copolymer techniques can further reduce pitch of lithographic techniques, unfortunately, however, DSA techniques cannot provide enough pre-patterns for etching particular features (such as slot contacts) with acceptable uniformity and fidelity.

Techniques disclosed herein, provide a method for increasing pattern density for creating high-resolution contact openings and other features. Patterning techniques herein combine double patterning techniques, sidewall image techniques, as well as novel planarizing and orientation techniques. Patterning techniques herein can quadruple a density of features in a given pattern. In other words, such patterning techniques can take an initial critical dimension pitch and reduce this initial pitch so that it is a quarter or eighth of its initial size. This feature reduction technique also provides features or openings having high uniformity and fidelity.

One embodiment includes a method for patterning a substrate. This method includes providing a substrate having first structures located on a target layer. The first structures include parallel elongated structures oriented in a first direction. The first structures comprise at least two layers of material including an upper material layer positioned on a planarization stop layer. Each elongated structure of the parallel elongated structures has a predetermined width and has a positioning that defines a horizontal distance between each other that is equal to three times the predetermined width. A first conformal film is deposited on exposed surfaces of the first structures and on exposed surfaces of the target layer. The conformal film has a deposited thickness approximately equal to the predetermined width. The first conformal film is etched (anisotropically) such that material from the conformal film is removed from a top surface of the upper material layer and removed from the target layer surfaces at locations between sidewall depositions of the conformal film. A fill material is deposited that fills spaces defined between the sidewall depositions of the conformal film. The substrate is planarized by removing conformal film material, fill material, and the upper material layer such that a substantially planar surface is formed at an upper horizontal surface of the planarization stop layer. This results in a planar surface of the substrate with alternating lines of differing material. This patterning technique used on the first structures can be repeated with second structures on top of the planarized surface, but with elongated features from the second structures oriented to cross over underlying lines.

The result of this patterning process yields crossing lines of elongated features of the conformal film material (and/or other materials used). Each point of crossing defines a contact opening, slot, or other featured to transfer to an underlying target layer. Accordingly, an etch process is executed that etches the conformal film material while selectively not etching the filler material and mandrel material. This etch process can be highly anisotropic. In practice, elongated lines or features of the conformal film material on the upper layer would be entirely removed during a selective etch process, while lines of the fill material and mandrel material would protect etching entire lines of the conformal film material on the lower layer. The result is that only a point of intersection of conformal film material lines is transferred to an underlying target layer. This patterning and etch operation can thus define a contact opening, line segment, or slot (or other feature) into an underlying target layer. The two crossed multi-compositional layers can then be removed.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein include increasing pattern density for creating high-resolution contact openings, slots, trenches, and other features. Patterning techniques herein combine double patterning techniques, sidewall image techniques, as well as novel planarizing and orientation techniques. Patterning techniques herein can quadruple a density of features in a given pattern. In other words, such patterning techniques can take an initial critical dimension pitch and reduce this initial pitch so that it is a quarter or eighth of its initial size. This feature reduction technique also provides features or openings having high uniformity and fidelity.

In one example embodiment, an initial pre-pattern having a 1 to 3 aspect spacing ratio is transferred into two or more layers below to create bi-layer or multi-layer mandrels. A conformal material is wrapped around these bi-layer mandrels. The conformal material is anisotropically etched to expose tops of mandrels and top of a target underlying layer at locations between sidewall spacers of the conformal material. A filler material is then deposited so as to fill spaces between the conformal material (now sidewall spacers). This multi-compositional layer of double-stacked mandrels, sidewall spacers, and fill material is horizontally planarized such that an upper portion of the double stacked mandrel is removed. In other words, this multi-compositional layer is planarized down to a top surface of a planarization stop layer in the double stacked mandrel. A result of this operation is a set of elongated features having an approximately equal width with the conformal film alternating between mandrel material and fill material. After this planar, multi-compositional layer is completed, a similar patterning process is repeated to yield a second planar, multi-compositional layer that is positioned on top of the initial, planar, multi-compositional layer. The second multi-compositional layer, however, is not oriented identically to the first multi-compositional layer, but instead is a pattern of elongated features that cross features from the first layer, such as a perpendicular crossing. This orientation can be orthogonal or selected to be any particular angle sufficient for elongated features from each layer to cross over each other. In other words, the orientation of the two layers is not parallel with each other.

Figure 3:
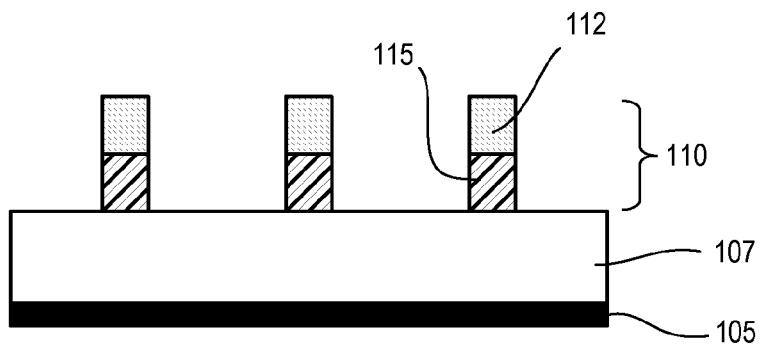
FIG. 3 is a cross-sectional schematic side view of an example substrate segment showing a process flow according to embodiments disclosed herein.

Example embodiments will now be described with reference to illustrations. Referring now to FIG. 3, embodiments include a method for patterning a substrate 105. Substrate 105 can include one or more underlying layers, as well as refer to a substrate in general upon which multiple different features can be deposited and formed. This method includes providing a substrate 105 having first structures 110 located on a target layer 107. The first structures 110 include parallel elongated structures oriented in a first direction. Note that the entire pattern may or may not include parallel linear structures, but at least a portion of the first structures include multiple parallel linear structures. The view in FIG. 3 is of the elongated direction of lines and thus first structures 110 appear as mandrels. The first structures 110 comprising at least two layers of material including an upper material layer 112 positioned on a planarization stop layer 115. Each elongated structure of the parallel elongated structures has a predetermined width and has a positioning that defines a horizontal distance between each other that is equal to three times the predetermined width. Thus, for a least a portion of the substrate 105, feature lines run parallel with each other, and each have a width equal to 3 times a spacing distance between each other. A relative height of each of the upper material layer 112 and the planarization stop layer 115 can depend on various design objectives of a particular fabrication scheme.

The first structures 110 can be considered as a two-layer mandrel or double-stacked mandrel. Although FIG. 3 shows two layers comprising the mandrels, more than two layers can be used to create these mandrels. Various different materials can be used also. By way of a non-limiting example, the upper material layer 112 can be amorphous carbon, polysilicon, oxide, etc. The upper material layer 112 can be comprised of a material different than the planarization stop layer 115. The upper material layer 112 will eventually be removed by planarization and so plasma etch selectivity for subsequent processes does not need to be a factor for selection of this material, but good choices include materials that can be planarized by CMP relatively easily. The planarization stop layer 115 can be silicon nitride (SiN), titanium nitride, silicon-germanium based materials, etc. Material selected for the planarization stop layer 115 should be a material that resists chemical-mechanical polishing. In other words, the planarization stop layer material is selected to provide a CMP-stop layer.

Also note that a spacing defined by the first structures 110, that is, a distance between adjacent structures of the first structures, can be equal to three times a given width of a given (individual) structure that is part of the first structures 110. In other words, the substrate is provided having a double-stacked mandrel at a 1:3 spacing ratio, or at some other spacing ratio.

Figure 1:
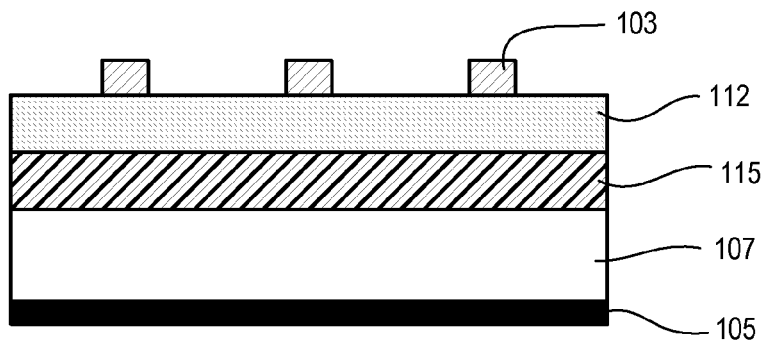
FIG. 1 is a cross-sectional schematic side view of an example substrate segment showing a process flow according to embodiments disclosed herein.

Various different patterning schemes or operations can be used to arrive at the substrate stack shown in FIG. 3. For example, referring to FIG. 1, planarization stop layer 115 can be deposited on target layer 107. Upper material layer 112 can then be deposited on planarization stop layer 115. A pre-pattern 103, which can be a relief pattern, can be formed to create a pattern in the underlying layers. This pre-pattern layer can be a result of a double patterning process that has already been executed. In some embodiments, the pre-pattern 103 can be photoresist that has been patterned by photolithography. Note that this pre-pattern layer can have a 1:3 spacing ratio. In other words, each topographic feature in the pre-pattern has a predetermined width, and the spacing distance between these topographic features is equal to the predetermined width. Note that these topographical features include elongated portions that form a set of parallel lines or parallel topographic features. The layers below the pre-pattern layer can be deposited as films via various deposition techniques.

Note also that other spacing schemes can be used. 1:3 pre-pattern spacing is beneficial in that the result is a 1-1-1 spacing after reduction. Other embodiments can be used for narrow trench applications and can start with other pre-pattern ratios such as 1:10. For other contact creation schemes, an initial 1:5 ratio can be used (small contact-large space-small contact-large space. A smaller ratio can enable a larger etch budget or tolerance. With a smaller contact there is more room for an over-etch while staying within a given CD budget. Another option is to form double trenches that include a large space and a double trench (an example ratio could be 1:3:1:8:1:3:1:8).

Figure 2:
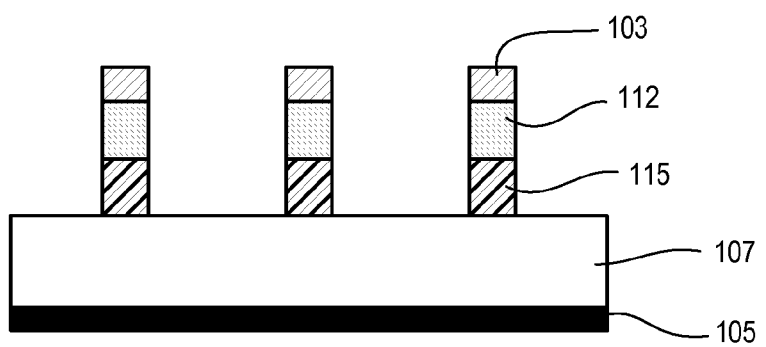
FIG. 2 is a cross-sectional schematic side view of an example substrate segment showing a process flow according to embodiments disclosed herein.

Whichever pre-pattern and spacing scheme selected can be transferred into two or more underlying layers to form double-stacked or triple stacked mandrels as shown in FIG. 2. Such a pattern transfer is typically executed via an anisotropic etch process. Etch chemistry can be adjusted depending on types of materials being etched. After etch transfer of the pre-pattern layer is completed, the pre-pattern layer can be removed via conventional material removal techniques based on type of materials used. This can include an ashing process or a wet-clean process, etc. The result is a pattern of first structures.

Figure 4:
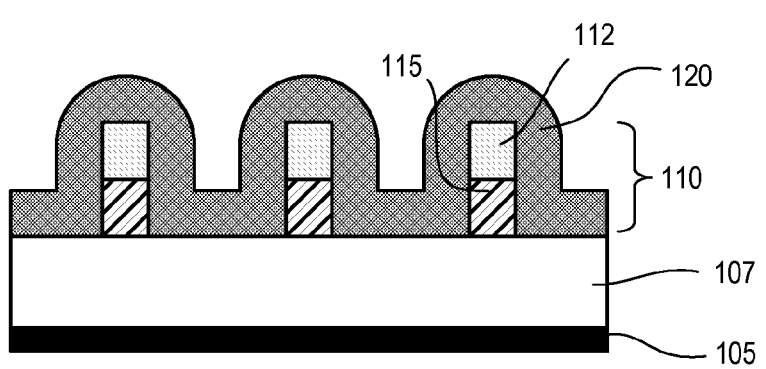
FIG. 4 is a cross-sectional schematic side view of an example substrate segment showing a process flow according to embodiments disclosed herein.
Figure 5:
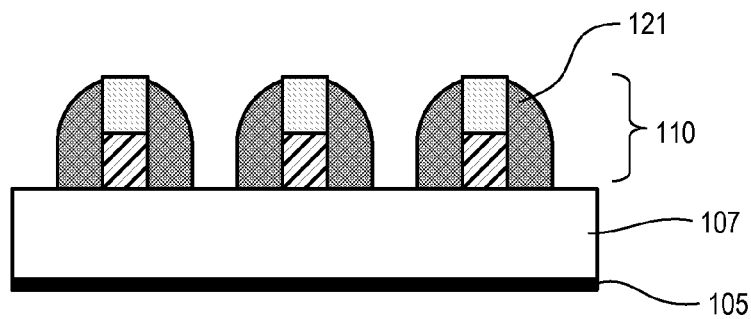
FIG. 5 is a cross-sectional schematic side view of an example substrate segment showing a process flow according to embodiments disclosed herein.

Referring now to FIG. 4, a first conformal film 120 is deposited on exposed surfaces of the first structures 110 and on exposed surfaces of the target layer 107. First conformal film 120 can have a deposited thickness approximately equal to the predetermined width of the first structures. In other embodiments a deposited thickness can be greater than or less than the predetermined width of the first structures. In some embodiments, the thickness of the conformal film can be relatively small because the conformal film will be subsequently supported and not need to be free-standing. Such a conformal film can be applied via atomic layer deposition (ALD), for example. One benefit of using ALD is that a thickness of such a conformal film can be controlled on an atomic level. By way of a non-limiting example, first conformal film 120 can be an oxide.

After deposition of the first conformal film 120, sidewall spacers 121 are created from the first conformal film 120. This can be accomplished by executing an anisotropic etch that removes conformal film material from top surfaces of the first structures and from the target layer 107 at locations between sidewall spacers. Note that some conformal film can remain on the target layer 107 at locations adjacent to the first structures, but an area defined between sidewall spacers 121 (and, by extension, between first structures 110) is removed.

Figure 6:
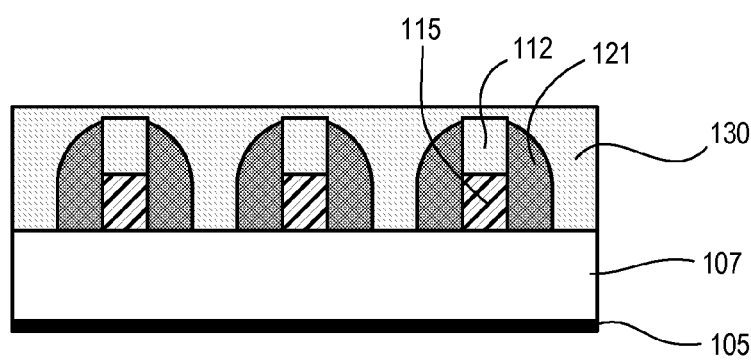
FIG. 6 is a cross-sectional schematic side view of an example substrate segment showing a process flow according to embodiments disclosed herein.

After sidewall spacers 121 have been created, a fill material 130 is deposited on the substrate 105 that fills spaces defined between the sidewall spacers 121 of the first conformal film 120. An example result is shown in FIG. 6. Note that this fill deposition is not required to completely cover the upper material layer 112. Completely filling spaces between structures can be beneficial or convenient, but alternative embodiments can function with spaces being filled to a level at—or just above—the planarization stop layer 115 (for example, above a silicon nitride top surface). Note that fill material 130 only needs to be deposited up to a top horizontal surface of the planarization stop layer. In practice, however, it can be easier to overfill with the fill material 130. In some embodiments an overfill can be three times greater than the height of the structures. The fill material 130 (gap fill material) can be amorphous carbon, polysilicon or any material that gives selectivity to the spacer material and the planarization stop layer 115 so that it is possible to selectively exhume the conformal material. In some embodiments, particular types of photoresist can be used for fill material 130. Other options include amorphous silicon or a spin-on-glass (SOG) material. Ideal materials can be easily planarized using CMP. The fill material 130 can be deposited as a spin fill or any type of overcoat material that has selectivity to etching of the conformal film material. Amorphous carbon can be beneficial because it coats evenly, and can be easily planarized, and is relatively economical to apply, though other materials are also suitable.

Figure 7:
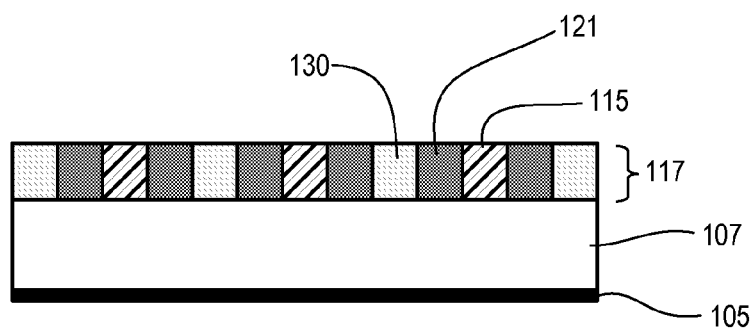
FIG. 7 is a cross-sectional schematic side view of an example substrate segment showing a process flow according to embodiments disclosed herein.
Figure 8:
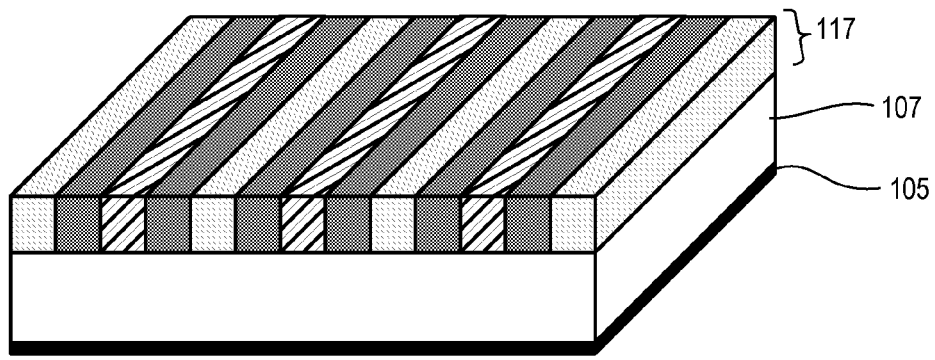
FIG. 8 is a cross-sectional schematic perspective view of an example substrate segment showing a process flow according to embodiments disclosed herein.

At this point the substrate can then be planarized. Such planarization of the substrate is executed by removing conformal film material, deposited fill material, and upper material layer 112 such that a substantially planar surface is formed at an upper horizontal surface of the planarization stop layer 115 (given that the substrate is considered to be positioned horizontally). Planarization can be accomplished using chemical-mechanical polishing (CMP) techniques, which are conventionally known. A result is shown in FIG. 7. Silicon nitride, for example, provides a good CMP-stop material. Accordingly, this patterning sequence for FIGS. 3-7 can be considered a line-generation sequence that converts a topographic pattern of double-stacked (or triple-stacked) mandrels at a given spacing into a planarized multi-line layer that includes parallel lines of oxide (or other material) alternatingly bounded by silicon nitride and amorphous carbon (or other materials), as shown in the FIGS. 7 and 8. Thus, a film that originated as a space is now flanked on either side by two or more materials—flanked on one side by silicon nitride, and flanked on the other side by amorphous carbon. This multi-line layer, being planar, is thus "stackable" in that additional layers can be deposited on this planarized multi-line layer.

Techniques herein include duplicating the generation of this multi-line layer with a second multi-line layer stacked on top of the first multi-line layer. The second multi-line layer, however, is positioned such that its parallel lines differ in orientation from parallel lines from the first or initial multi-line layer, and elevationally cross the first multi-line layer. In other words, lines from the second multi-line layer run across lines from the first multi-line layer (relative to a top view of the lines). The benefit of such cross placement or alignment of each multi-line layer is that relatively small contact openings can be created by virtue of film layers crossing with a combination of two levels. Accordingly, substrates can have a first planar multi-line layer comprising lines made of three different materials.

Figure 9:
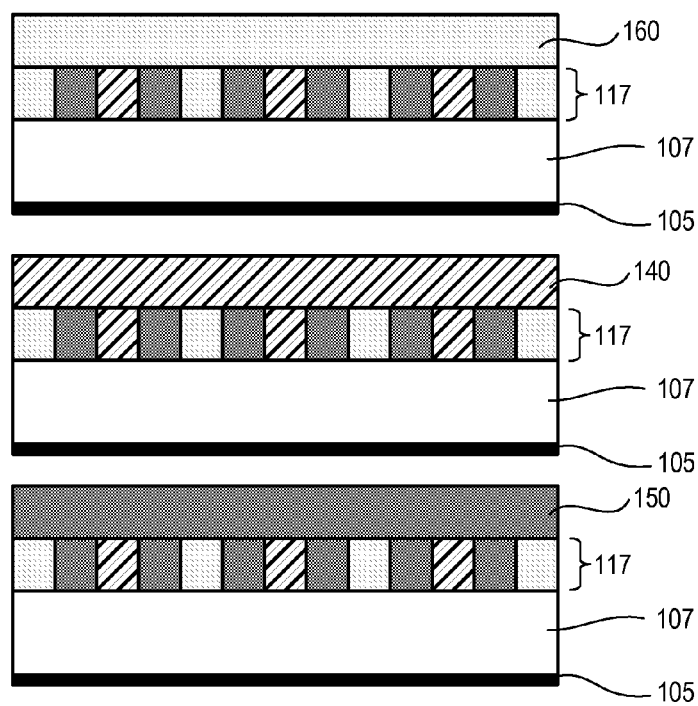
FIG. 9 is a cross-sectional schematic side view of an example substrate segments showing a process flow according to embodiments disclosed herein.
Figure 10:
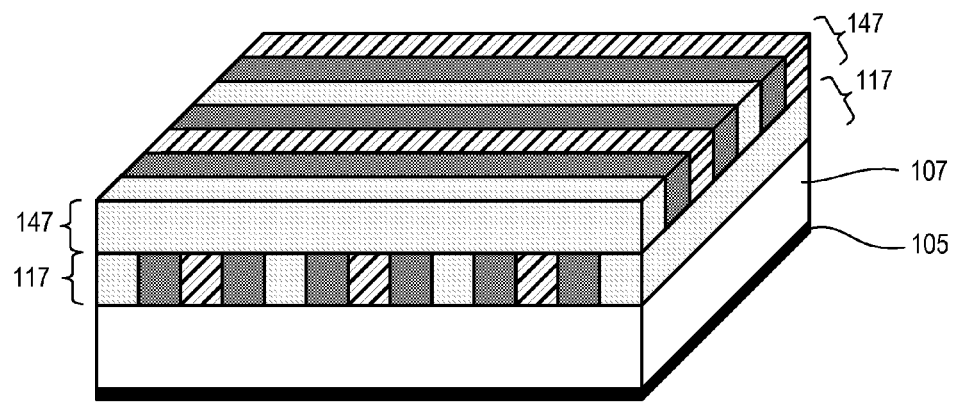
FIG. 10 is a cross-sectional schematic perspective view of an example substrate segment showing a process flow according to embodiments disclosed herein.

With the first planar multi-line layer completed, the patterning process can be repeated. This can include creating a 1:3 spacing (or other spacing) of double-stacked (or triple-stacked) mandrels, which are then wrapped in a conformal film. Note that creating the pattern of double-stacked mandrels can use an additional lithography steps or alignment (for example, depositing anti-reflective layer (silicon oxynitride), mask layer, photo resist, etc.) The conformal film is etched to create sidewall spacers, and deposited fill material planarizes the substrate by deposition. Subsequently, a material removal-based planarizing process (such as CMP) is used to planarize the substrate using the planarization stop layer of the mandrels as a planarizing stop layer. This patterning sequence generates a second multi-line layer which is oriented such that conformal film lines in the second multi-line layer cross over conformal film lines from the first multi-line layer. FIG. 10 shows an example illustration of the crossing of two multi-line planarized layers, that is, first multi-line layer 117 is crossed by second multi-line layer 147. In some embodiments, the orientation of the second multi-line layer can be rotated 90° relative to the first multi-line layer. The benefit of this stacked patterning sequence is that contact openings or holes can be created at a very small scale with a high degree of uniformity and fidelity. FIG. 9 shows three different cross sectional side view of substrate 105 to illustrate how lines of three different materials perpendicularly and elevationally cross first multi-line layer 117. These materials can include second conformal film material 150, second fill material 160, and second planarization stop layer 140.

Thus, embodiments can include providing second structures located on the substantially planar surface. The second structures include second parallel elongated structures oriented in a second direction. The second direction can position parallel elongated structures to elevationally cross parallel elongated structures from the first structures. An angle of crossing parallel elongated structures can be approximately orthogonal. The second structures comprise at least two layers of differing material including a second upper material layer positioned on a second planarization stop layer. Each second elongated structure of second parallel elongated structures can have a width equal to the predetermined width and have a positioning that defines a horizontal distance between each other equal to three times the predetermined width. A second conformal film is deposited on exposed surfaces of the second structures and on exposed surfaces of the substantially planar surface. The second conformal film has a deposited thickness approximately equal to the predetermined width. Note that deposition may not occur directly on the substantially planar surface as one or more patterning films may have been applied with created a second pre-pattern.

The second conformal film is etched anisotropically such that material from the second conformal film is removed from a top surface of the second upper material layer and removed from the substantially planar surface at locations between sidewall depositions of the second conformal film. A second fill material is deposited that fills spaces defined between the sidewall depositions of the second conformal film, and the substrate is planarized by removing second conformal film material, second fill material, and the second upper material layer such that a second substantially planar surface is formed at an upper horizontal surface of the second planarization stop layer.

Embodiments can include performing a contact etch operation that anisotropically etches the second conformal film material and conformal film material (or that selectively etches one of the other types of materials).

Contact openings or holes can be created by executing an anisotropic etch process using chemistry that reacts with one of the materials while being selective to the remaining two materials in that the etch chemistry either does not etch the other two materials or etches the other two materials at a significantly slower rate. One valuable benefit of this technique is that a critical dimension or film thickness of an ALD-deposited film can provide a basis for transferring an etch pattern. This is extremely beneficial because ALD-deposited films can have dimensions controlled on an atomic level, thus, such atomically-controlled CDs become CDs that are transferred. Accordingly, relatively thin conformal films can be deposited, which are subsequently supported on both sides which removes any toppling danger.

Figure 11:
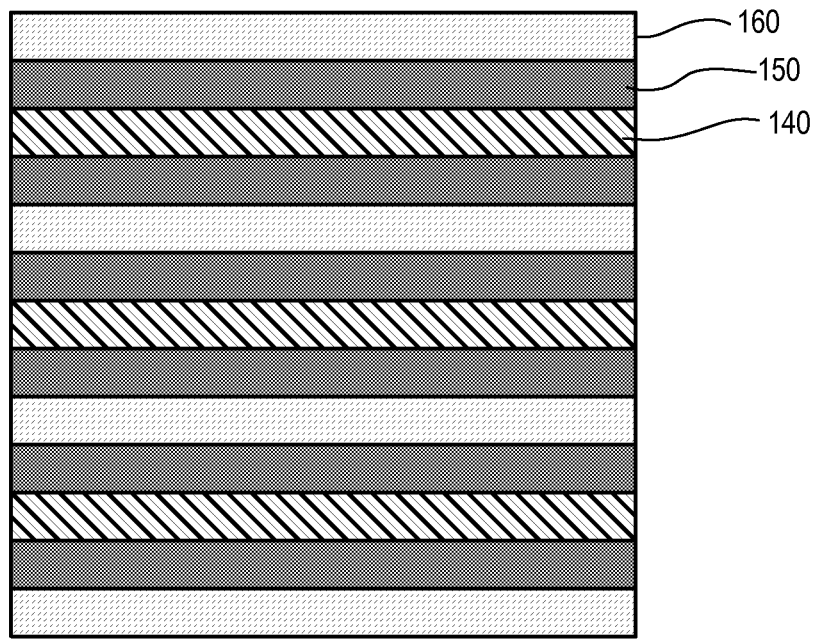
FIG. 11 is a cross-sectional schematic top view of an example substrate segment showing a process flow according to embodiments disclosed herein.

Note that in a given etch operation of the double stacked layers, a particular material to be selectively etched will be completely removed from the second multi-line layer 147 because entire lines of this material will be exposed to reactive agents in a given plasma processing chamber. FIG. 11 shows a top view of second multi-line layer 147, which is positioned on first multi-line layer 117. Note that from this view lines of three different material layers are exposed or visible to a plasma. A given etch process is then initiated that selectively etches the second conformal film material 150 without substantially etching the second fill material 160 or the second planarization stop layer 140. By way of a specific example, an ALD oxide film is etched using a chemistry that does not substantially etch amorphous carbon or silicon nitride. In other words, material selection for the spacer material is such that the spacer material can be etched selective to both the planarization stop layer and the fill material.

Figure 12:
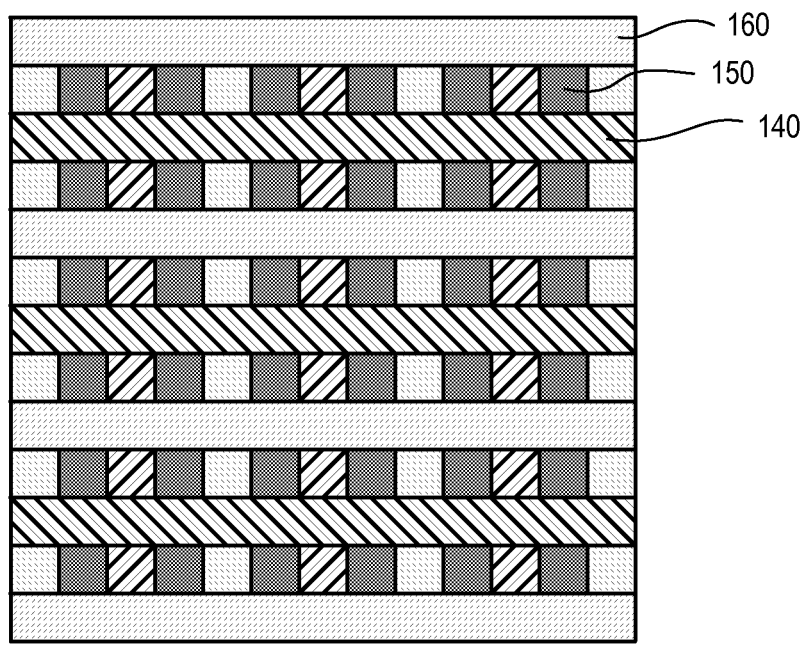
FIG. 12 is a cross-sectional schematic top view of an example substrate segment showing a process flow according to embodiments disclosed herein.

During this etch process, eventually all conformal film material from the second multi-line layer 147 will be etched away. This will uncover a top surface of the first multi-line layer 117 (bottom multi-line layer). FIG. 12 shows portions of an upper surface of the first multi-line layer 117 being exposed and now visible through trenches where second conformal film material 150 used to be on the second multi-line layer 147. Note that because the first multi-line layer 117 is oriented orthogonal to the second multi-line layer 147, an alternating pattern of material is now uncovered and visible through newly created trenches in the second multi-line layer 147. For convenience, this etch step is explained as if an etch step were stopped at this point to show what is uncovered after etching through the second conformal film material 150 from the second multi-line layer 147. In practice, however, a given etching step can be continuous through both multi-line layers and even into the target layer 107, though etch chemistry may need to change to etch target layer 107.

Figure 13:
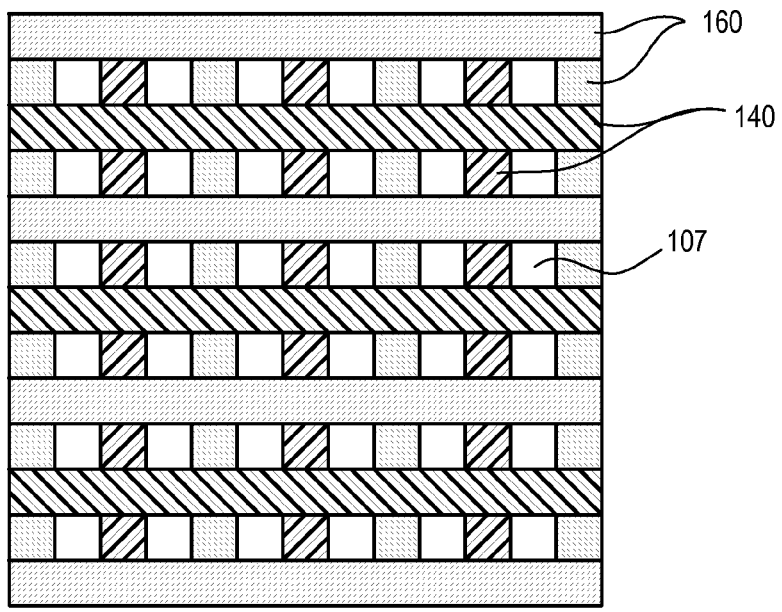
FIG. 13 is a cross-sectional schematic top view of an example substrate segment showing a process flow according to embodiments disclosed herein.

As the etching operation continues through the first multi-line layer 117, rectangular holes are created at locations where conformal film lines cross each other, with remaining cross material lines functioning as a mask. After completing this etch operation through both multi-line layers, portions of target layer 107 is uncovered as shown in FIG. 13. With this technique, a well-defined opening can be etched all the way down to a contact.

Figure 14:
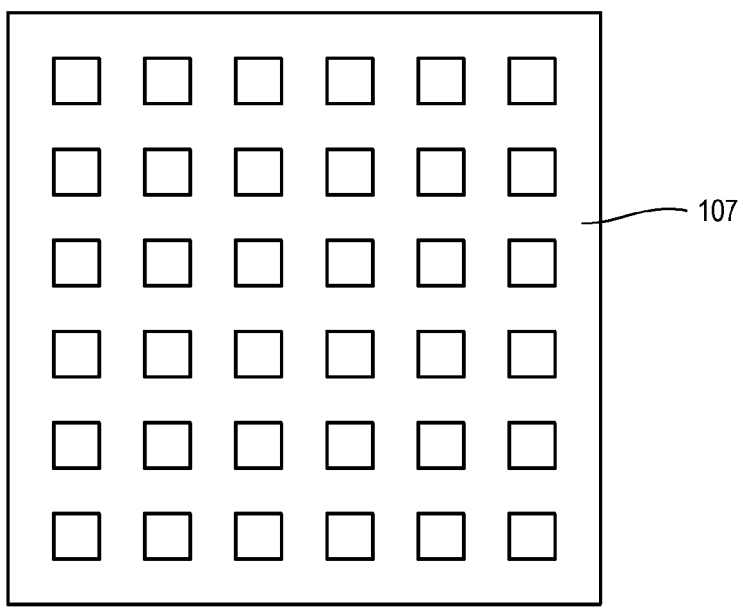
FIG. 14 is a cross-sectional schematic top view of an example substrate segment showing a process flow according to embodiments disclosed herein.
Figure 15:
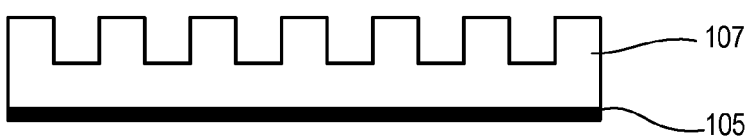
FIG. 15 is a cross-sectional schematic side view of an example substrate segment showing a process flow according to embodiments disclosed herein.

The remaining lines of fill material and planarization stop layer material layer (amorphous carbon and silicon nitride) then function as a mask for transferring contact openings into or through the target layer. Both multi-line layers can then be removed resulting in a target layer having a pattern of very small contact openings. Example results are shown in FIG. 14 (top view), and FIG. 15 (cross-sectional side view).

Thus, techniques herein can quadruple a density of an initial pitch creating what can be referred to as a "quad" or multi-line/multi-runner layer. Two of these quads or multi-line layers are stacked and crossed (non-parallel placement), with both layers having been planarized. Then one of the film materials can be anisotropically etched (exhumed) such that a crossing point of a particular film from the stacked multi-layer combination is a point of extraction during an etching step. In other words, a particular spacer material is etched and then the crossed layers define an intersection point of lines of material that can be etched all the way through both layers into an underlying layer. Thus, the X-dimension of a CD and a Y-dimension of a CD now define effectiveness of a flow. These X and Y dimensions came from between top stack and bottom stack runners/lines. Each of the spacer materials to be etched/exhumed, can be an atomic layer deposition (ALD) layers, which can be accurate on an atomic scale, which could be considered as at or near the limits of accuracy for material films.

Etching/exhuming ALD materials is possible because of the CMP planarization step which cuts through the spacers prior to a subsequent transfer. Conventionally, in sidewall image transfer flows, it is the space between spacers that is used for transferring a pattern. With techniques herein however a CMP step is used on a double-stacked mandrel to cut through the middle of a sidewall spacer. This cut spacer is then be exhumed in a subsequent transfer step instead of using a space between sidewall spacers as a hard mask. Conventionally, sidewall spacers remain and are used as the hardmask for transferring a pattern. Such a conventional technique, however, suffers from uniformity problems. For example, rounding effects from etched spacers do not allow scaling in smaller dimensions—or at least do not allow scaling uniformly.

This planarization step, in conjunction with the substrate stack used herein, however, blocks out non-uniformities that result from rounding effects. By having a double-stacked mandrel (or triple-stacked mandrel) a middle or planarization stop layer of the multi-stacked mandrel can be a SiN layer functioning as a nitride CMP stop material. Thus, the mandrel is provided or created with a CMP stop within the mandrel itself. Such mandrel creation can be executed by first depositing a silicon nitride film and then depositing amorphous carbon film on top of the nitride film. A height or thickness of the nitride layer can be selected such that a CMP step can cut into a spacer at an optimal point to remove rounding effects of an upper portion of the spacer (a point below rounded spacer edges, and above any mandrel footers). This helps to provide an oxide runner or line having a substantially rectangular cross-section. This helps provide a smooth, planar surface for stacking multi-line, pitch-reducing layers.

In some embodiments, an oxide or oxide-like film can be deposited underneath the nitride film, which can eliminate any footer problems created from etching a pre-pattern to create the multi-layer mandrels. Thus an oxide or oxide-like film is selected to be etched as if it were an oxide such that any protruding feet will not block a final oxide film etch when transferring a pattern to an underlying layer.

Other embodiments include a method of patterning a substrate. The method includes providing mandrels of a first pattern on an underlying layer. The mandrels have at least two layers including a mandrel top layer positioned on a mandrel bottom layer. A deposition process is executed that deposits a conformal film on exposed surfaces of the mandrels and of the underlying layer. Optionally, a thickness of the conformal film can be approximately equal to a width of the mandrels. In other embodiments, a thickness of the conformal film can be greater than or less than a width of the mandrels. Some embodiments can include having sidewall spacers with a high aspect ratio (5:1 or 10:1, etc., for example) because sidewall spacers created from the conformal film will be supported on both sides by material.

The conformal film anisotropically etched such that the conformal film is removed from top surfaces of mandrels and from the underlying layer at locations between sidewall portions of the conformal film. A planarization fill layer is deposited that fills spaces defined between the mandrels and conformal film spacers. The substrate is planarized such that material on the substrate is removed down to top surfaces of the mandrel bottom layer so as to result in parallel lines of mandrel bottom layer, conformal film material, and planarizing fill material.

Embodiments can also include providing second mandrels of a second pattern oriented on the substrate such that lines of second mandrels cross the parallel lines of mandrel bottom layer, conformal film material, and planarizing fill material. The second mandrels have at least two layers including a second mandrel top layer and a second mandrel bottom layer. A second deposition process is executed that deposits a second conformal film on exposed surfaces of the second mandrels. A thickness of the second conformal film is equal, less than, or greater than a width of the second mandrels. The second conformal film is anisotropically etched such that the second conformal film is removed from top surfaces of second mandrels and from between sidewall portions of the second conformal film. A second planarization fill layer is deposited that fills spaces defined between the second mandrels and second conformal film spacers. The substrate is planarized such that material on the substrate is removed down to top surfaces of the second mandrel bottom layer.

This embodiment can also include etching the second conformal film and the conformal film using second mandrels and the second planarizing fill layer as an etch mask. Alternatively, the second mandrels and the mandrels are etched using the second conformal film and the second planarizing fill layer as an etch mask, or the second planarizing fill layer and the planarizing fill layer are etched using second mandrels and the second conformal film as an etch mask. The first pattern can include a 1:3 spacing ratio such that a distance between mandrels is approximately three times a width of mandrels. Note that other spacing patterns can be selected and result in various different line widths. Techniques here also enable using conformal films with high aspect ratios and/or very small thicknesses. Note also that any number of masks, cut masks, or patterns can be deposited on top of the planarized substrate of parallel lines (or line segments). For example, a top mask layer can define only a few contact locations to transfer, with a remaining portion of the substrate being masked. In another example, a relatively large array of points is transferred into an underlying layer.

In another embodiment, a method of patterning a substrate includes providing a substrate having a relief pattern of first structures positioned on a target layer. The first structures in the relief pattern of first structures comprise at least two layers of material including an upper layer positioned on a lower layer. The lower layer is comprised of a first material. The first structures have a predetermined width and including parallel elongated structures defining a horizontal distance between each other. A first line-generation sequence is executed that converts the relief pattern of first structures into a first planarized multi-line layer that includes parallel lines of first material alternatingly bounded by lines of a second material and a third material. A relief pattern of second structures is provided or created and positioned on the first planarized multi-line layer. The relief pattern of second structures comprises at least two layers of material including a second upper layer positioned on a second lower layer. The lower layer is comprised of a fourth material. The second structures have a predetermined width and include parallel elongated structures defining a horizontal distance between each other. The second structures are oriented such that second structures elevationally cross over the parallel lines of the first material. A second line-generation sequence is executed that converts the relief pattern of second structures into a second planarized multi-line layer that includes parallel lines of fourth material alternatingly bounded by lines of a fifth material and a sixth material.

The first line generation sequence can include conformally depositing an oxide film on exposed surfaces of the first structures and on exposed surfaces of the underlying target layer via atomic layer deposition, etching the oxide film to remove oxide film from horizontal surfaces of the first structures and between sidewall depositions of the oxide film, depositing amorphous carbon on the substrate such that amorphous carbon fills spaces defined between the sidewall depositions of the oxide film, and planarizing the substrate via chemical-mechanical polishing such that planarization stops on the lower layer. Additional steps can include anisotropically etching the oxide film through both the first planarized multi-line layer and the second planarized multi-line layer. The horizontal distance between each parallel elongated structure can be equal to three times the predetermined width of the first structures. The first material can be an oxide, the second material a nitride, and the third material amorphous carbon. The first material and the fourth material are a same material, wherein the second material and the fifth material are a same material, and wherein the third material and the sixth material are a same material.

Accordingly, pattern density can be increased (quadrupled) for creating high-resolution contact openings, slots, trenches, and other features.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
    providing a substrate having first structures located on a target layer, the first structures including parallel elongated structures oriented in a first direction, the first structures comprising at least two layers of material including an upper material layer positioned on a planarization stop layer, each elongated structure of the parallel elongated structures having a predetermined width and having a positioning that defines a horizontal distance between each other that is equal to three times the predetermined width;
    depositing a first conformal film on exposed surfaces of the first structures and on exposed surfaces of the target layer, the conformal film having a deposited thickness approximately equal to the predetermined width;
    etching the first conformal film anisotropically such that material from the conformal film is removed from a top surface of the upper material layer and removed from the target layer surfaces at locations between sidewall depositions of the conformal film;
    depositing a fill material that fills spaces defined between the sidewall depositions of the conformal film;
    planarizing the substrate by removing conformal film material, fill material, and the upper material layer such that a substantially planar surface is formed at an upper horizontal surface of the planarization stop layer;
    providing second structures located on the substantially planar surface, the second structures including second parallel elongated structures oriented in a second direction, the second structures comprising at least two layers of differing material including a second upper material layer positioned on a second planarization stop layer, each second elongated structure of second parallel elongated structures having a width equal to the predetermined width and having a positioning that defines a horizontal distance between each other equal to three times the predetermined width;

depositing a second conformal film on exposed surfaces of the second structures and on exposed surfaces of the substantially planar surface; the second conformal film having a deposited thickness approximately equal to the predetermined width;

etching the second conformal film anisotropically such that material from the second conformal film is removed from a top surface of the second upper material layer and removed from the substantially planar surface at locations between sidewall depositions of the second conformal film;

depositing a second fill material that fills spaces defined between the sidewall depositions of the second conformal film; and planarizing the substrate by removing second conformal film material, second fill material, and the second upper material layer such that a second substantially planar surface is formed at an upper horizontal surface of the second planarization stop layer.

2. The method of claim 1, wherein the second direction positions parallel elongated structures to elevationally cross parallel elongated structures from the first structures.

3. The method of claim 2, wherein an angle of crossing of parallel elongated structures is approximately orthogonal.

4. The method of claim 1, further comprising:
performing a contact etch operation that anisotropically etching the second conformal film material and conformal film material.

5. The method of claim 1, wherein the upper material layer is comprised of a material different than the planarization stop layer.

6. The method of claim 1, wherein planarizing includes executing a chemical-mechanical polishing (CMP) process.

7. The method of claim 1, wherein the planarization stop layer comprises silicon nitride, wherein the conformal film materials comprise an oxide, and wherein the fill material comprises amorphous carbon.

8. The method of claim 7, wherein the upper material layer is amorphous carbon.

9. A method of patterning a substrate, the method comprising:
providing mandrels of a first pattern on an underlying layer, the mandrels having at least two layers including a mandrel top layer positioned on a mandrel bottom layer;

executing a deposition process that deposits a conformal film on exposed surfaces of the mandrels and of the underlying layer;

etching the conformal film anisotropically such that the conformal film is removed from top surfaces of mandrels and from the underlying layer at locations between sidewall portions of the conformal film;

depositing a planarization fill layer that fills spaces defined between the mandrels and conformal film spacers; and planarizing the substrate such that material on the substrate is removed down to top surfaces of the mandrel bottom layer, resulting in parallel lines of mandrel bottom layer, conformal film material, and planarizing fill material.

10. The method of claim 9, further comprising:
providing second mandrels of a second pattern oriented on the substrate such that lines of second mandrels cross the parallel lines of mandrel bottom layer, conformal film material, and planarizing fill material, the second mandrels having at least two layers including a second mandrel top layer and a second mandrel bottom layer;

executing a second deposition process that deposits a second conformal film on exposed surfaces of the second mandrels;

etching the second conformal film anisotropically such that the second conformal film is removed from top surfaces of second mandrels and from between sidewall portions of the second conformal film;

depositing a second planarization fill layer that fills spaces defined between the second mandrels and second conformal film spacers; and planarizing the substrate such that material on the substrate is removed down to top surfaces of the second mandrel bottom layer.

11. The method of claim 10, further comprising: etching the second conformal film and the conformal film using second mandrels and the second planarizing fill layer as an etch mask.

12. The method of claim 10, further comprising: etching the second mandrels and the mandrels using the second conformal film and the second planarizing fill layer as an etch mask.

13. The method of claim 10, further comprising: etching the second planarizing fill layer and the planarizing fill layer using second mandrels and the second conformal film as an etch mask.

14. The method of claim 10, wherein the first pattern includes a 1:3 spacing ratio such that a distance between mandrels is approximately three times a width of mandrels.

15. A method of patterning a substrate, the method comprising:
providing a substrate having a relief pattern of first structures positioned on a target layer, the first structures in the relief pattern of first structures comprising at least two layers of material including an upper layer positioned on a lower layer, the lower layer comprised of a first material, the first structures having a predetermined width and including parallel elongated structures defining a horizontal distance between each other;

executing a first line-generation sequence that converts the relief pattern of first structures into a first planarized multi-line layer that includes parallel lines of first material alternatingly bounded by lines of a second material and a third material;

providing a relief pattern of second structures positioned on the first planarized multi-line layer, the relief pattern of second structures comprising at least two layers of material including a second upper layer positioned on a second lower layer, the lower layer comprised of a fourth material, the second structures having a predetermined width and including parallel elongated structures defining a horizontal distance between each other, the second structures being oriented such that second structures elevationally cross over the parallel lines of the first material; and executing a second line-generation sequence that converts the relief pattern of second structures into a second planarized multi-line layer that includes parallel lines of fourth material alternatingly bounded by lines of a fifth material and a sixth material.

16. The method of claim 15, wherein the first line generation sequence comprises:

conformally depositing an oxide film on exposed surfaces of the first structures and on exposed surfaces of the underlying target layer via atomic layer deposition;

etching the oxide film to remove oxide film from horizontal surfaces of the first structures and between sidewall depositions of the oxide film;

depositing amorphous carbon on the substrate such that amorphous carbon fills spaces defined between the sidewall depositions of the oxide film; and planarizing the substrate via chemical-mechanical polishing such that planarization stops on the lower layer.

17. The method of claim 16, further comprising:
anisotropically etching the oxide film through both the first planarized multi-line layer and the second planarized multi-line layer.

18. The method of claim 17, wherein the horizontal distance between each parallel elongated structure is equal to three times the predetermined width of the first structures.

19. The method of claim 15, wherein the first material is an oxide, the second material is a nitride, and the third material is amorphous carbon.

20. The method of claim 19, wherein the first material and the fourth material are a same material, wherein the second material and the fifth material are a same material, and wherein the third material and the sixth material are a same material.

* * * * *